United States Patent
Amano et al.

(10) Patent No.: US 12,246,556 B2
(45) Date of Patent: Mar. 11, 2025

(54) METAL TONE DECORATIVE SHEET AND METAL TONE DECORATIVE MOLDED BODY PROVIDED WITH METAL TONE DECORATIVE SHEET

(71) Applicant: DAI NIPPON PRINTING CO., LTD., Tokyo (JP)

(72) Inventors: Tsuyoshi Amano, Tsukuba (JP); Atsushi Tokumitsu, Kashiwa (JP); Yuki Togo, Nagareyama (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 343 days.

(21) Appl. No.: 17/788,170

(22) PCT Filed: Dec. 24, 2020

(86) PCT No.: PCT/JP2020/048440
§ 371 (c)(1),
(2) Date: Jun. 22, 2022

(87) PCT Pub. No.: WO2021/132461
PCT Pub. Date: Jul. 1, 2021

(65) Prior Publication Data
US 2023/0033148 A1    Feb. 2, 2023

(30) Foreign Application Priority Data
Dec. 27, 2019  (JP) .................. 2019-239468

(51) Int. Cl.
*B44F 5/00*  (2006.01)
*B44C 1/10*  (2006.01)
*B44C 1/14*  (2006.01)

(52) U.S. Cl.
CPC .............. *B44F 5/00* (2013.01); *B44C 1/105* (2013.01); *B44C 1/14* (2013.01)

(58) Field of Classification Search
CPC .. B44F 5/00; B44C 1/105; B44C 1/14; B05D 5/067; C23C 14/26; H01Q 1/425
See application file for complete search history.

(56) References Cited

U.S. PATENT DOCUMENTS

| 2010/0272932 | A1 | 10/2010 | Izumo et al. |
| 2019/0275759 | A1 | 9/2019 | Nishio et al. |
| 2019/0315093 | A1* | 10/2019 | Nishio ................ G01S 13/931 |

FOREIGN PATENT DOCUMENTS

| JP | 2002212324 | A | * | 7/2002 |
| JP | 2007118350 | A | * | 5/2007 |

(Continued)

OTHER PUBLICATIONS

Espacenet Translation of JP-2002212324-A (Year: 2024).*

(Continued)

*Primary Examiner* — Michael Zhang
(74) *Attorney, Agent, or Firm* — Oliff PLC

(57) ABSTRACT

A metal tone decorative sheet has an excellent metallic luster and electromagnetic wave transmissivity, and a metal tone decorative molded body is provided with the metal tone decorative sheet. A metal tone decorative sheet includes a metal layer on a base material layer, wherein the metal layer includes a plurality of island portions containing metal and a sea portion positioned between the island portions, the island portion is a convex quadrangle in a cross-sectional view, one side of the quadrangle being opposed to the base material layer, and $0 \leq x-y \leq 80$ where a length of a side of the island portion on the base material layer side is x [nm] and a length of a side of the island portion on an opposite side to the base material layer is y [nm].

8 Claims, 5 Drawing Sheets

(56) References Cited

FOREIGN PATENT DOCUMENTS

| | | | |
|---|---|---|---|
| JP | 2010-251899 A | 11/2010 | |
| JP | 2011-027434 A | 2/2011 | |
| JP | 2011140126 A * | 7/2011 | |
| JP | 5809768 B1 | 11/2015 | |
| JP | 2016-65297 A | 4/2016 | |
| JP | 2018-069462 A | 5/2018 | |
| JP | 2018-154878 A | 10/2018 | |
| JP | 2019-209550 A | 12/2019 | |
| JP | 2021-024251 A | 2/2021 | |
| WO | 2009/110090 A1 | 9/2009 | |
| WO | WO-2018003847 A1 * | 1/2018 | ............ B32B 15/01 |
| WO | 2019/208493 A1 | 10/2019 | |
| WO | 2019/208499 A1 | 10/2019 | |
| WO | 2019/230955 A1 | 12/2019 | |
| WO | 2020/153137 A1 | 7/2020 | |
| WO | WO-2021132456 A1 * | 7/2021 | |

OTHER PUBLICATIONS

Espacenet Translation of JP-2011140126-A (Year: 2024).*
Jan. 2, 2024 Extended European Search Report Issued in European Patent Application No. 20904569.9.
Mar. 16, 2021 International Search Report issued in International Patent Application No. PCT/JP2020/048440.

* cited by examiner

METAL TONE DECORATIVE SHEET AND METAL TONE DECORATIVE MOLDED BODY PROVIDED WITH METAL TONE DECORATIVE SHEET

TECHNICAL FIELD

The present invention relates to a metal tone decorative sheet and a metal tone decorative molded body provided with the metal tone decorative sheet.

BACKGROUND ART

In order to enhance the designability of a molded body, it has hitherto been performed to give a metallic luster on the surface of the molded body. As a means of giving the metallic luster, a means in which a decorative sheet having a metallic luster is arranged in a mold, a resin is injected into the mold, thereby adhering a metal vapor deposited sheet to a molded body, is known (e.g., PTL1).

In particular, a decorative sheet on which a vapor deposition film made of indium or tin is formed can transmit electromagnetic waves of the radar wavelength such as millimeter waves. Using this property, the decorative film is applied to emblems of vehicles equipped with anti-collision radar, handles equipped with vehicle door lock and unlock sensors, and the like (e.g., PTL2).

CITATION LIST

Patent Literature

PTL1: JP 5809768 B1
PTL2: JP 2016-65297 A

SUMMARY OF INVENTION

Technical Problem

PTL2 defines the average area of the vapor deposited indium particles so that the indium vapor deposition film can have a desired hue from the visual viewpoint of the observer. However, the indium vapor deposition film is not examined from the viewpoint of metallic luster. Hence, it has been difficult to obtain an expected metallic luster.

An object of the present invention is to provide a metal tone decorative sheet having a desired metallic luster and a metal tone decorative molded body provided with the metal tone decorative sheet.

Solution to Problem

The inventor of the present application has examined and as a result, found in a metal layer comprising a so-called "sea-island structure" having a plurality of island portions and a sea portion between the island portions that the cross-section of the island portion is a convex quadrangle such as a rectangle and a trapezoid, and furthermore, the reflectance of a metal tone decorative sheet largely varies depending on the difference between the length of a side on the base material layer side and the length of a side on the opposite side to the base material layer, and therefore, the shape of the island portion is required to be appropriately controlled.

That is, to solve the above problems, the present invention provides the following [1] to [8].

[1] A metal tone decorative sheet comprising a metal layer on a base material layer, wherein the metal layer comprises a plurality of island portions containing metal and a sea portion positioned between the island portions; the island portion is a convex quadrangle in a cross-sectional view, one side of the quadrangle being opposed to the base material layer; and $0 \leq x-y \leq 80$ where a length of a side of the island portion on the base material layer side is x [nm] and a length of a side of the island portion on an opposite side to the base material layer is y [nm].

[2] The metal tone decorative sheet according to [1], wherein a reflectance at a wavelength of 550 nm is 60% or more.

[3] The metal tone decorative sheet according to [1] or [2], further comprising an adhesive layer on the metal layer side being an opposite side to the base material layer, wherein the sea portion are filled with a part of the adhesive layer, and the x [nm] and the y [nm] satisfy $0 \leq x-y 80$ nm.

[4] The metal tone decorative sheet according to [3], wherein the x [nm] and the y [nm] satisfy $10 \leq x-y \leq 80$ nm.

[5] The metal tone decorative sheet according to any one of [1] to [4], wherein an area ratio of the sea portion when the metal layer is viewed in a plan view is 10% or more and 25% or less.

[6] The metal tone decorative sheet according to any one of [1] to [5], wherein when each island portion is assumed to be a circle and an average value of the diameter calculated from an area per one island portion is defined as a size of the island portion, the size is 100 nm or more and 300 nm or less.

[7] The metal tone decorative sheet according to any one of [1] to [6], wherein the metal layer contains indium or tin.

[8] A metal tone decorative molded body comprising the metal tone decorative sheet according to any one of [1] to [7] and an adherend.

Advantageous Effects of Invention

According to the present invention, a metal tone decorative sheet having a desired metallic luster and a metal tone decorative molded body provided with the metal tone decorative sheet can be obtained.

DESCRIPTION OF EMBODIMENTS

Hereinafter, the metal tone decorative sheet and metal tone decorative molded body of the present invention will be described in detail. Note that, the description of the numerical value range "AA to BB" in the present specification means "AA or more and BB or less."

[Metal Tone Decorative Sheet]

The metal tone decorative sheet of the present invention is a metal tone decorative sheet comprising a metal layer on a base material layer, wherein the metal layer comprises a plurality of island portions containing metal and a sea portion positioned between the island portions, the island portion is a convex quadrangle in a cross-sectional view, one side of the quadrangle being opposed to the base material layer, and 0≤x−y≤80 where a length of a side of the island portion on the base material layer side is x [nm] and a length of a side of the island portion on an opposite side to the base material layer is y [nm].

The metal layer in the metal tone decorative sheet of the present invention has a "sea-island structure" comprising a plurality of island portions containing metal and a sea portion positioned between the island portions. An example thereof is the structure illustrated in FIG. 2, in which a plurality of island portions is closely packed and the island portions are separated by the sea portion. The structure illustrated in FIG. 2 can be viewed when the metal tone decorative sheet is observed from the metal layer side with a scanning electron microscope. Since the metal layer has the sea-island structure, it is possible to achieve a metal tone decorative sheet having a metallic luster.

[Cross-Sectional Shape of Island Portion]

In the present invention, the cross-sectional shape of the island portion can be seen from the electron microscope image.

First, the metal tone decorative sheet is embedded in a resin. The resin is provided to fix the metal tone decorative sheet and to obtain a sharp cross-section when the metal tone decorative sheet is cut in the lamination direction to observe the cross-section. For the resin, for example, a thermosetting resin composed of a mixture of epoxy phenol novolac and imidazole can be used.

Then, the metal tone decorative sheet provided with a resin layer is cut in the lamination direction (the direction substantially orthogonal to the plane of the base material layer). The cross-section is subjected to electron microscopy under the following conditions to obtain an image.

Figure 1:
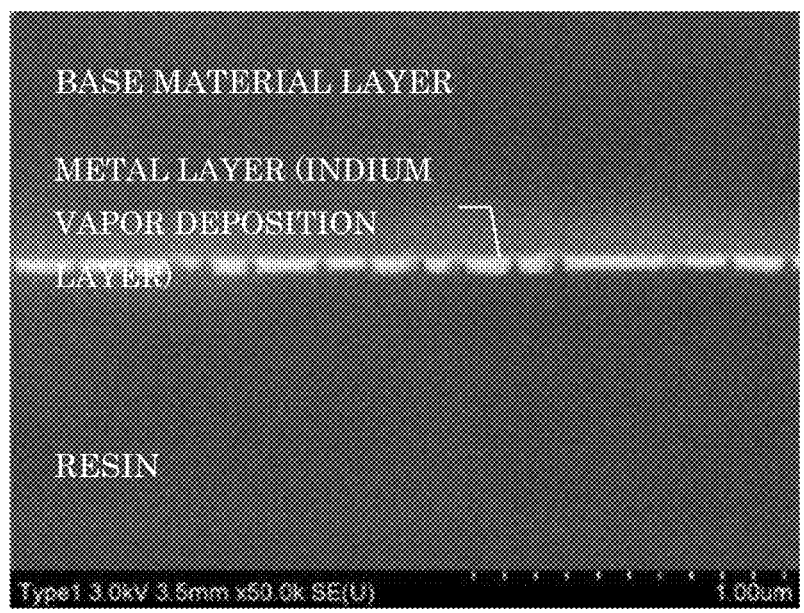
FIG. 1 is a scanning electron micrograph of a cross-section of the metal tone decorative sheet of Example 1.

<Cross-Section Observation Conditions>
  Apparatus: scanning electron microscope
  Observation conditions
    Accelerating voltage: 3 kV
    Emission current: 10 μA
    Pixel size: 0.9 to 1.0 nm
    Working distance: 3.5 mm
    Observation magnification: 50,000 times
    Gradation: 8 bit FIG. 1 is one example of the images obtained by observing the cross-section of a metal tone decorative sheet having a two-layer structure in which a metal layer is formed on a base material layer, with an electron microscope.

In the present invention, the island portion of the metal layer is a convex quadrangle in the cross-sectional view. Note that, the corner portion is usually observed as a curved surface on the opposite side to the base material layer, in the island portion. In addition, a shape in which the periphery of the corner portion is higher than the central portion of the island portion may be observed, in some cases. In the present invention, such a case is also referred to as the "quadrangle" by approximating the shape.

Figure 3:
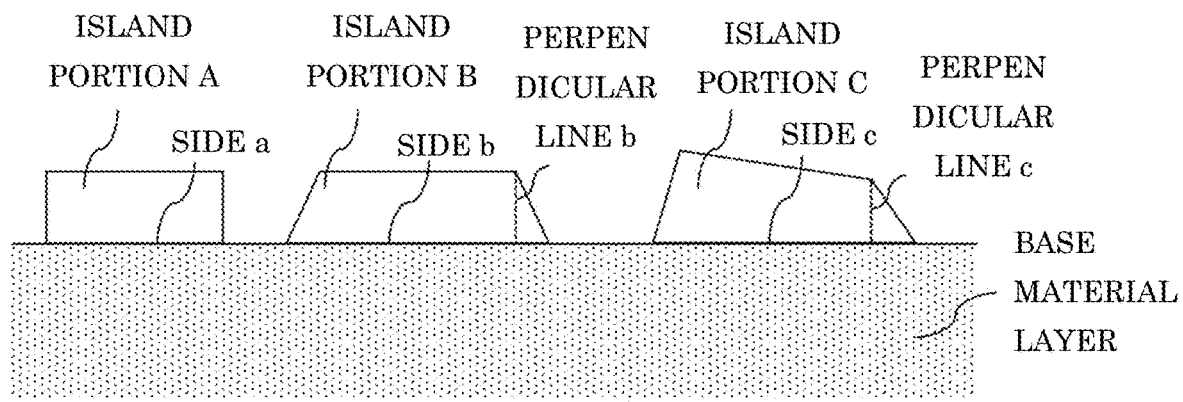
FIG. 3 is a diagram for illustrating the cross-sectional shapes of island portions.

Preferred examples of the shape of the island portion in the cross-sectional view are illustrated in FIG. 3.

The cross-section of the island portion A is a rectangle. One side a of the island portion A which is a rectangle is positioned on the base material layer side and opposes to the base material layer. In FIG. 3, the entire side a is in contact with the base material layer. As described below, in the case where other layers (e.g., primer layer) are formed between the base material layer and the metal layer, the entire side a comes into contact with a layer adjacent to the metal layer among the other layers.

The cross-section of the island portion B is a trapezoid. One side b of the island portion B which is a trapezoid is positioned on the base material layer side and opposes to the base material layer. In FIG. 3, the entire side b is in contact with the base material layer. As described below, in the case where other layers (e.g., primer layer) are formed between the base material layer and the metal layer, the entire side b comes into contact with a layer adjacent to the metal layer among the other layers. In the present invention, the island portion B is preferably a trapezoid having a shape in which extended lines of two hypotenuses cross on the metal layer side. In addition, the island portion B preferably has a shape in which, when perpendicular lines are drawn from the ends of both two hypotenuses on the opposite side to the base material layer to the base material layer side, the perpendicular lines cross the side b (see FIG. 3).

The cross-section of the island portion C is a quadrangle whose all opposing sides are not parallel. One side c is positioned on the base material layer side and opposes to the base material layer. In FIG. 3, the entire side c is in contact with the base material layer. As described below, in the case where other layers (e.g., primer layer) are formed between the base material layer and the metal layer, the entire side c comes into contact with a layer adjacent to the metal layer among the other layers. In addition, the island portion C preferably has a shape in which, when perpendicular lines are drawn from the ends of both two hypotenuses on the opposite side to the base material layer to the base material layer side, the perpendicular lines cross the side c (see FIG. 3).

Here, the side (the side a, the side b, and the side c in FIG. 3) being in contact with the base material layer (or the layer between the base material layer and the metal layer) is referred to as the "side on the base material layer side".

Figure 4:
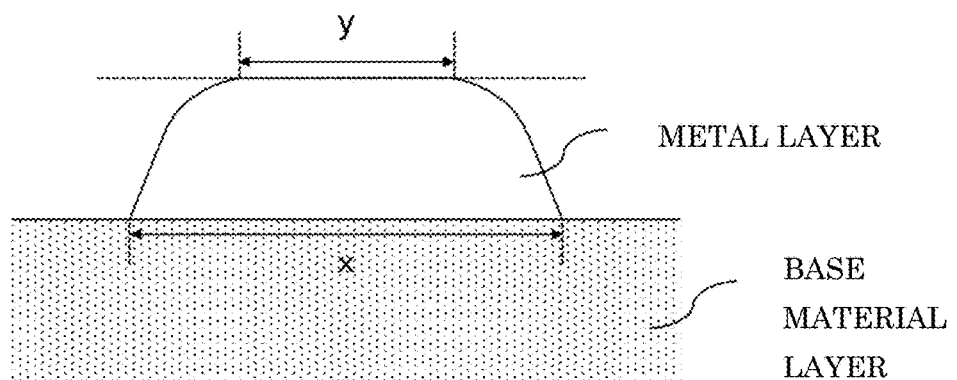
FIG. 4 is a diagram for illustrating the lengths x and y of the island portion.

With respect to one island portion in the cross-sectional image obtained by the above means, the length x [nm] of the side on the base material layer side and the length y [nm] of the side on the opposite side to the base material layer are calculated. The lengths x and y are calculated based on the definition illustrated in FIG. 4. FIG. 4 illustrates the case where the island portion has a shape in which the corner portion is a curved surface.

The length x of the side on the base material layer side corresponds to the distance between both ends at which the island portion and the base material layer come into contact with each other. The length y of the side on the opposite side to the base material layer side is calculated by the following methods (i) to (iii).

(i) In the cross-sectional image, a long line that overlaps the extending direction of the central portion of the island portion on the side opposite to the base material layer and is longer than the central portion is drawn. The extending direction of the central portion of the island portion refers to the extending direction of the side on the opposite side to the base material layer, in the cases of the island portions A to C in FIG. 3.

(ii) In the cross-sectional image, the starting point where the island portion is separated from the line is defined as the "corner portion", in both end regions of the island portion.

(iii) The distance between the corner portions on the line is defined as the "side on the opposite side to the base material layer", and the length y is measured on the image.

When the island portion has a shape in which the periphery of the corner portion is higher than the central portion of the island portion, the length y is calculated by the following methods (iv) to (vi) based on the same idea as FIG. 4.

(iv) In the cross-sectional image, a long line that overlaps the central portion (corresponding to the flat portion) of the island portion on the opposite side to the base material layer and is longer than the central portion is drawn.

(v) In the cross-sectional image, the point of intersection of the line and the slope of the island portion is defined as the "corner portion", in both end regions of the island portion.

(vi) The distance between the corner portions on the line is defined as the "side on the opposite side to the base material layer", and the length y is measured on the image.

In the present invention, the length x [nm] and the length y [nm] of the sides of the island portion satisfy the relationship of the equation (1).

$$0 \leq x-y \leq 80 \quad (1)$$

The relationship with $0 \leq x-y$ means that the case where the cross-section of the island portion is a rectangle is included. Furthermore, the case where the cross-section of the island portion is a trapezoid or a quadrangle as illustrated in FIG. 3 means that the side on the base material layer side is longer. That is, when viewed stereoscopically, the island portion has a cylinder shape or a frustum shape in which the bottom surface is in contact with the base material layer.

The relationship with $x-y \leq 80$ means that the cross-section of the island portion is a trapezoid or a quadrangle as illustrated in FIG. 3 and the difference in length between the upper base and the lower base is small (closer to rectangle). A large value of x-y means that the side of the island portion on the opposite side to the base material layer is short and the island portion has a shape closer to a triangle when the metal layer is viewed in a cross-section. In the case of such a shape, when the metal layer is viewed in a plan view, the area of the outer peripheral portion corresponding to the side slope of the frustum-shaped island portion is larger. Since the thickness of this outer peripheral portion is thinner than that of the central portion of the island portion, the incident light may be transmitted. The larger the area of the outer peripheral portion is, the more the amount of transmitted light increases. Thus, the larger x-y is, the lower the reflectance tends to be. Since the cross-sectional shape of the island portion satisfies the relationship of the equation (1), a metal tone decorative sheet having a desired reflectance is achieved. Considering the reflectance, x-y is preferably 60 nm or less, and more preferably 40 nm or less. The cross-section of the island portion is particularly preferably close to a rectangle (that is, x-y is close to 0 nm).

Furthermore, the lower limit value of x-y is preferably more than 0, further preferably 5 nm or more, and particularly preferably 10 nm or more. When x-y falls within the above range, the lateral side of the cross-section of the island portion becomes a slope. Thus, when an adhesive layer is formed on the metal layer to adhere the sheet to an adherend, as described below, the portion between the island portions (the sea portion) are easily filled with a resin for the adhesive layer, resulting in a favorable interlayer adhesion between the metal layer and the adhesive layer. When a metal tone decorative molded body in which a metal tone decorative sheet and an adherend are attached by an adhesive layer is used for the exterior of a vehicle body such as an automobile, peeling (also referred to as chipping) of the surface layer derived from flying stones during the running of the vehicle body may be caused. Chipping can be prevented by improving the interlayer adhesion between the metal layer and the adhesive layer. In particular, the chipping resistance can be further improved by satisfying 10 nm x-y.

The difference between the length x of the side on the base material layer side and the length y of the side on the opposite side to the base material layer in the island portion (x-y) can be adjusted by changing the wettability to the metal layer and the surface on which the metal layer is formed, the vapor deposition time of the metal layer, and the base material temperature during vapor deposition. For example, in order to achieve a cross-sectional shape of the island portion close to a rectangle, the metal layer is formed on a surface that has poor wettability to the metal layer. On the other hand, the better the wettability to the metal layer, the larger the value of x-y.

Examples of the surface on which the metal layer is formed include a base material layer and a primer layer, as described below. In the present invention, the wettability can be changed by a means for changing the material of the base material layer and the primer layer depending on the material of the metal layer, a means for subjecting the surface on which the metal layer is formed to physical or chemical surface treatment, or the like, so that the difference in length of the island portion (x-y) is adjusted.

In the present invention, the difference between respective lengths (x-y) is calculated for one island portion. For the island portions that can be seen in the observed cross-sectional image, the lengths x and y are measured for each of them, and the difference in length (x-y) is calculated. Furthermore, cross-sectional observation is carried out at 20 places in the plane of the metal layer of the metal tone decorative sheet, and the difference in length (x-y) is calculated. Then, it is preferred that the average value of the differences in the obtained lengths satisfy the equation (1).

[Reflectance of Metal Tone Decorative Sheet]

The metal tone decorative sheet in the present invention preferably has a reflectance of 60% or more. By setting the reflectance to 60% or more, a metal tone decorative sheet having a reflectance equivalent to the case where a film having a known metallic luster such as chrome plating can be achieved. The reflectance is preferably 61% or more, and more preferably 62% or more.

Note that the reflectance in the present invention is a value obtained when light having a wavelength of 550 nm is made incident from the base material layer side at an incidence angle of 5 degrees. The reflectance can be obtained using a spectrometer.

[Examples of Layer Configuration of Metal Tone Decorative Sheet]

Specific examples of the layer configuration of the metal tone decorative sheet include the following (1) to (8). The term "/" means a boundary between the respective layers.

(1) Base material layer/Metal layer/Adhesive layer
(2) Base material layer/Metal layer/Adhesive layer/Release layer
(3) Base material layer/Primer layer/Metal layer/Adhesive layer
(4) Base material layer/Primer layer/Metal layer/Adhesive layer/Release layer
(5) Base material layer/Metal layer/Adhesive layer/Backer layer (6) Base material layer/Primer layer/Metal layer/Adhesive layer/Backer layer
(7) Base material layer/Metal layer/Adhesive layer/Backer layer/Adhesive layer
(8) Base material layer/Primer layer/Metal layer/Adhesive layer/Backer layer/Adhesive layer Hereinafter, the configuration of the layers will be described in detail.

<Base Material Layer>

The base material layer has a role as a support of the metal tone decorative sheet. The base material layer is preferably arranged on the outermost layer side when formed into a decorative molded body. Thus, the base material layer has a role to give scratch resistance to the metal tone decorative sheet and the metal tone decorative molded body. In this case, the base material layer preferably has transparency from the viewpoint that the metal layer is visible.

As the base material layer, it is preferred to use a plastic film containing a resin, such as a polyolefin-based resin such as polyethylene and polypropylene; a vinyl-based resin such as polyvinyl chloride, polyvinylidene chloride, polyvinyl alcohol, an ethylene-vinyl acetate copolymer, and an ethylene-vinyl alcohol copolymer; a polyester-based resin such as polyethylene terephthalate, polyethylene naphthalate, and polybutylene terephthalate; an acrylic resin such as polymethyl (meth)acrylate and polyethyl (meth)acrylate; a styrenic resin such as polystyrene; a polyamide-based resin represented by nylon 6 or nylon 66; and an ABS resin (acrylonitrile-styrene-butadiene copolymer resin).

Of these resins, an acrylic resin is suitable because it has not only excellent weather resistance and formability but also excellent transparency due to its low refractive index, and scratches are less noticeable. When an indium vapor deposition film or a tin vapor deposition film is directly formed as the metal layer on the base material layer and an acrylic resin or an olefinic resin is selected as the base material layer, the island portion of the metal layer can easily satisfy the equation (1).

The resin component that forms the base material layer may be used alone or in combination of two or more thereof. The base material layer may be formed of a single layer film made of these resins, or a multilayer film made of the same or different resins, and is preferably formed of a single layer film.

In the present invention, "(meth)acrylic" is a generic term for "acrylic" and "methacrylic", and other similar substances with (meth) have the same meaning.

To adjust the close adhesion and wettability to the metal layer, the below-described primer layer, and the like, one surface or both surfaces of the base material layer may be subjected to physical or chemical surface treatment such as an oxidation method or an unevenness method, as needed. Examples of the oxidation method carried out as the surface treatment of the base material layer include corona discharge treatment, plasma treatment, chromate treatment, flame treatment, hot air treatment, and an ozone ultraviolet treatment method. Examples of the unevenness method carried out as the surface treatment of the base material layer include a sandblast method and a solvent treatment method. These surface treatments are appropriately selected depending on the kind of resin component that constitutes the base material layer, and a corona discharge treatment method is preferred from the viewpoint of the effect, operability, and the like. In the case where an indium vapor deposition film is directly formed as the metal layer on the base material layer, the island portion of the metal layer can easily satisfy the equation (1) by carrying out surface treatment in this way.

The base material layer preferably has a haze according to JIS K7136:2000 of 5% or less, more preferably 3% or less, and further preferably 1% or less.

The base material layer preferably has a visible light transmittance according to JIS K7361-1:1997 of 85% or more, and more preferably 90% or more.

The thickness of the base material layer is appropriately set depending on the applications and the like of the metal tone decorative sheet, and is usually about 50 to 250 µm, preferably about 60 to 150 µm, and further preferably about 70 to 125 µm. When the thickness of the base material layer falls within the above range, the metal tone decorative sheet can have further excellent three-dimensional formability, designability, and the like.

<Primer Layer>

The primer layer is a layer that is provided as needed to improve the close adhesion between the metal layer and a layer adjacent to the metal layer (e.g., the base material layer), to prevent the metal layer from deteriorating due to the component (e.g., chlorine component) contained in the layer adjacent to the metal layer, and the like.

When the primer layer is used as the base in the formation of the metal layer by vapor deposition, the primer layer affects the cross-sectional shape of the island portion (in particular, the value of x−y) due to its wettability to the metal layer.

As the resin for the primer layer, a resin such as an acrylic resin, a polyurethane-based resin, an acryl-urethane copolymer resin, and a polyester-based resin can be used. From the viewpoint of easily satisfying the equation (1) and improving the close adhesion to the metal layer, the primer layer preferably contains an acrylic resin, a mixture of an acrylic resin and a vinyl chloride-vinyl acetate copolymer resin, or acrylic polyol and isocyanate. By using these resins, the island portion is likely to be a frustum shape, the sea portion are easily filled with the resin for the adhesive layer as described below, and furthermore, the resin for the adhesive layer and the primer layer are favorably closely adhered to each other, so that the chipping resistance can be improved. Considering the favorable close adhesion between the metal layer and the adhesive layer, the primer layer material preferably includes acrylic polyol and isocyanate.

The primer layer may contain additives such as an ultraviolet absorber and a photostabilizer.

The thickness of the primer layer is not particularly limited, and is usually about 0.5 to 2.5 µm, and preferably about 1 to 2 µm.

<Metal Layer>

Figure 2:
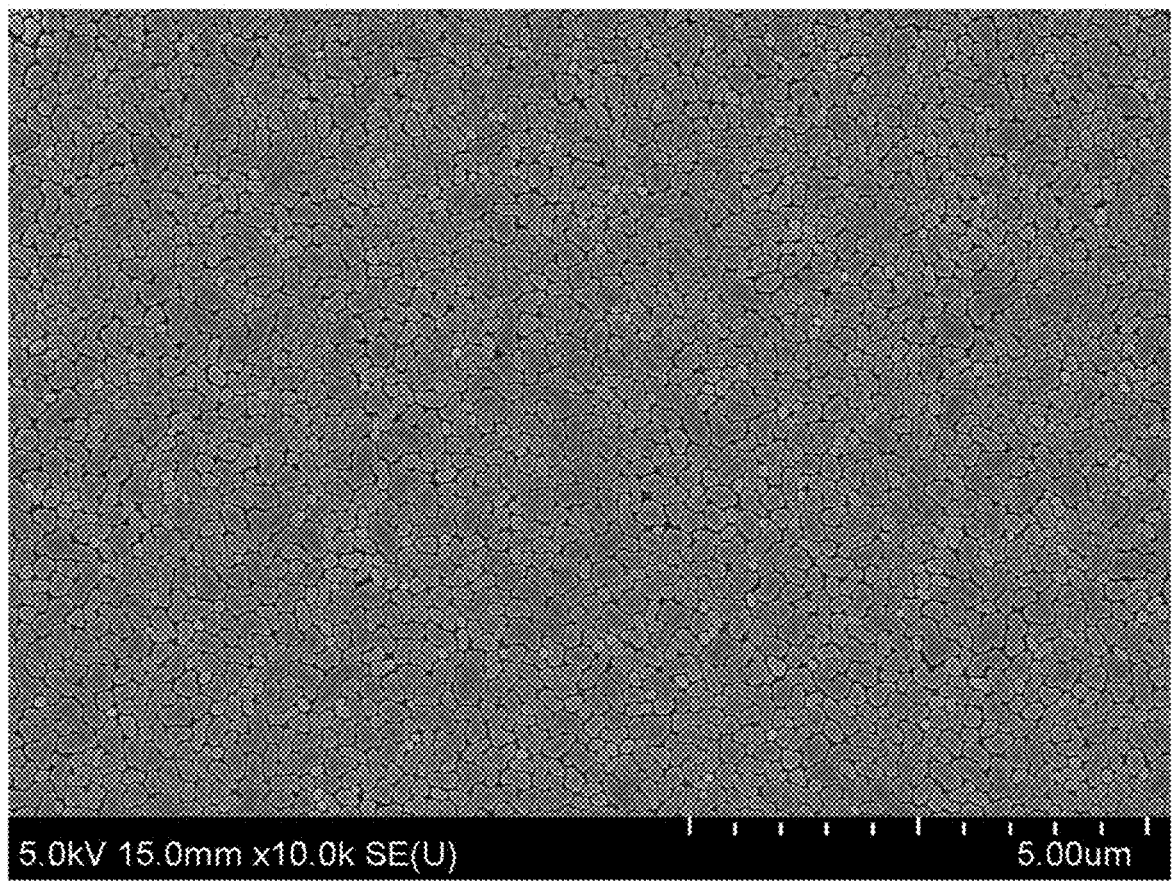
FIG. 2 is a scanning electron micrograph of a metal layer surface of the metal tone decorative sheet of Example 1.

The metal layer is a layer that is provided on the base material layer and gives a metallic luster to the metal tone decorative sheet. The metal layer of the present invention has a sea-island structure comprising a plurality of island portions containing metal and the sea portion positioned between the island portions, as illustrated in FIG. 2. Since the metal layer has the sea-island structure, radio wave transmissivity can be easily improved.

The metal layer of the present invention preferably has electromagnetic wave transmissivity to transmit electromagnetic waves of the radar wavelength. Specifically, the transmittance of the electromagnetic wave having a frequency of 76.5 GHz is preferably 90% or more, and more preferably 93% or more. In addition, the transmittance of the electromagnetic wave having a frequency of 100 kHz is preferably 93% or more, and more preferably 95% or more.

In the present invention, the metal layer preferably contains at least one of indium, tin, gold, and alloys thereof, from the viewpoint of easily forming a sea-island structure in the formation of the metal layer by vapor deposition. The metal layer more preferably contains metal having a melting point of 240° C. or less, and the metal layer further preferably contains indium or tin. Above all, indium tends to be the sea-island structure due to its low melting point. In addition, the metal layer made of indium is suitable in terms of having an excellent metallic luster and favorable weather resistance.

The reason why the metal layer containing indium or tin tends to form the sea-island structure is inferred as follows.

When metal having a relatively low melting point is formed into a film by vapor deposition, a relatively long time is required until the metal reached on the surface of the base solidifies. The higher the base material temperature during vapor deposition, the longer the time until solidification. Thus, it is considered that the metal before solidification moves on the surface of the base, collides with other metals, and coalesces to form island portions. It is considered that the island portions glow thereafter by incorporating the metal reached on the surface of the base therein while repeating collision and coalescence, whereby the sea-island structure is formed. In particular, indium and tin respectively have significantly low melting points of 156° C. and 232° C. Thus, it is considered that the solidification rate on the surface of the base is low and the aforementioned collision and coalesce occur frequently, so that the sea-island structure is further easily formed.

The value x–y can be adjusted by changing the wettability to the metal layer and the surface on which the metal layer is formed, the vapor deposition time of the metal layer, and the base material temperature during vapor deposition. The influence of the wettability to the base and the vapor deposition time on the cross-sectional shape of the island portion is inferred as follows.

When the wettability to the metal layer and the surface of the base is too high, the metal solidifies as the island portion having a small contact angle with respect to the base layer, that is, as the island portion having a high x–y value, in the early stage of vapor deposition. As the vapor deposition time increases and the film thickness increases, the island portion grows such that the length y increases relative to the length x. However, it is considered that the difference in length x–y is unlikely to be small due to the shape of the island portion in the early stage. Thus, it is considered that when the wettability is too high, the island portion of the metal layer tends to be difficult to satisfy the equation (1).

On the other hand, when the wettability to the metal layer is relatively low, the metal solidifies as the island portion having a large contact angle with respect to the base layer, in the early stage of vapor deposition. That is, it is considered that since the island portion close to a rectangle is likely to be formed in the early stage of vapor deposition, the difference in length x–y is likely to be relatively small. Thus, in the case where the wettability to the metal layer is relatively low, the island portion that satisfies the equation (1) tends to be easily obtained. In the case where the difference in length x–y does not satisfy the equation (1) in the early stage of vapor deposition, if a comparatively small island portion is formed, the island portion may grow such that the length y increases relative to the length x, the difference in length x–y may be relatively small, and thus the equation (1) may be satisfied by extending the vapor deposition time.

In the present invention, the surface free energy of the surface of the base material layer and the primer layer on which the metal layer is formed is preferably 40 mJ/m$^2$ or more, more preferably 41 mJ/m$^2$ or more, and preferably 56 mJ/m$^2$ or less, more preferably 55 mJ/m$^2$ or less. Particularly when the metal layer contains indium or tin, the surface free energy thereof is preferably 42 mJ/m$^2$ or more, more preferably 44 mJ/m$^2$ or more, and preferably 54 mJ/m$^2$ or less, more preferably 52 mJ/m$^2$ or less. When the surface free energy of the surface of the base material layer and the primer layer on which the metal layer is formed falls within the above range, the wettability to the metal layer is suitably adjusted and the difference in length of the island portion (x–y) is likely to satisfy the equation (1).

Examples of a method of forming the metal layer include physical vapor deposition (PVD) methods, such as a vacuum vapor deposition method, a sputtering method, and an ion plating method, and chemical vapor deposition (CVD) methods such as plasma CVD using plasma, and a catalytic chemical vapor deposition (Cat-CVD) method in which a source gas is subjected to catalytic cracking using a heating catalyst. Of these methods, a vacuum vapor deposition method that can be applied to all materials is preferred. That is, as the metal layer, a physical vapor deposition film is preferred, and above all, a vacuum vapor deposition film is preferred.

From the viewpoint of the metallic luster, formability, and the like, the metal layer is preferably formed such that the thickness per one island portion can be 30 to 100 nm, and more preferably 40 to 80 nm.

The thickness per one island portion can be adjusted, for example, by the time for vapor deposition. That is, when the vapor deposition time is prolonged, the thickness per one island portion can be increased.

The metal layer in the present invention preferably has an area ratio of the sea portion of 10% or more and 25% or less in a plan view. It means that the larger the area ratio of the sea portion, the larger the distance between the adjacent island portions. By setting the area ratio of the sea portion to 10% or more and 25% or less, the electromagnetic wave transmissivity can be further improved and a metal tone decorative sheet having a high reflectance (60% or more) can be easily obtained.

When a metal tone decorative molded body is produced by adhering a metal tone decorative sheet by injection molding or attaching a decorative formed sheet to a molded body, deformation due to following of the sheet to the three-dimensional curved surface, shrinkage of the sheet due to heat, and the like occur. At this time, the island portions may be brought into contact with each other during molding of the metal tone decorative molded body, thereby resulting in whitening of the metal tone decorative sheet. From the viewpoint of preventing whitening, the area ratio of the sea portion is preferably 10% or more, and more preferably 12% or more. On the other hand, when the area ratio of the sea portion is too large, it becomes difficult to achieve the reflectance of a metal tone decorative sheet of 60% (it becomes difficult to obtain a metallic luster). From this viewpoint, the area ratio of the sea portion is preferably 25% or less, and more preferably 23% or less.

In the present invention, the area ratio of the sea portion (%) can be determined by the following method.

First, the metal layer surface is subjected to electron microscopy under the following conditions to obtain an image.

Apparatus: scanning electron microscope
Observation Conditions
Accelerating voltage: 5 kV
Emission current: 10 µA
Pixel size: 9.5 to 10.0 nm
Working distance: 15 mm
Observation magnification: 10,000 times
Gradation: 8 bit 800,000 to 900,000 pixels are cut out from the image obtained in the observation under the above conditions. The cut image is subjected to binarization processing based on the Otsu's method. The proportion of the area of the sea portion relative to the whole cut image is designated as the area ratio (%) of the sea portion of this place. The same operation is carried out at 20 places on the image, and the average value of these 20 places is designated as the area ratio (%) of the sea portion of the metal layer.

When each island portion is assumed to be a circle and the average value of the diameter calculated from the area per one island portion is defined as the "size of the island portion", the metal layer in the present invention preferably has a size of the island portion of 100 nm or more and 300 nm or less. The "size of the island portion" thus defined corresponds to the length x of the side on the base material layer side when the island portion is viewed in the cross-section.

When the size of the island portion determined by the above definition is 100 nm, the island portion is likely to satisfy the equation (1). In addition, a high reflectance (60% or more) can be easily obtained. As a result, a metal tone decorative sheet having an excellent metallic luster can be obtained. Furthermore, when the size of the island portion is 125 nm or more, and more desirably 160 nm or more, a metal tone decorative sheet in which a metal layer having a further high reflectance can be easily obtained.

On the other hand, when the size of the island portion is too large, the electromagnetic wave transmissivity of the radar wavelength is likely to decrease. From this viewpoint, the size of the island portion is preferably 300 nm or less, and more preferably 275 nm or less.

The area per one island portion can be calculated by the following approach.

First, the electron microscope image of the metal layer surface is obtained under the same conditions as the calculation of the area ratio of the sea portion, and the image is subjected to binarization processing.

Then, a square frame into which 50 or more and 100 or less island portions can be entered is superimposed on the taken photograph. A length of one side of the frame is designated as L [nm]. "L" expresses the actual size on the sample, and for example, it can be calculated on the basis of a pixel size or scale bar of the SEM photograph.

Then, the number ($n_1$) of island portions that are entirely contained within the frame, the number ($n_2$) of island portions that are perceived to exist in a proportion of ½ or more and less than 1 of the area of the island portions within the frame, and the number ($n_3$) of island portions which are perceived to exist in a proportion of less than ½ of the area of the island portions within the frame are counted. "n" expressed by the following equation (i) on the basis of the counted $n_1$, $n_2$, and $n_3$ is made fictitious as the number of island portions existing within the frame.

$$n = n_1 + (3n_2 + n_3)/4 \quad \text{(i)}$$

Then, the total area of the island portions within the frame is calculated, and the total area is designated as "S [$nm^2$]".

Then, "a" expressed by the following equation (ii) on the basis of the S [$nm^2$] and the number (n) of island portions within the frame as calculated by the equation (i) is made fictitious as an area [$nm^2$] per island portion within the frame.

$$a = S/n \quad \text{(ii)}$$

As shown in the electron micrograph in FIG. 2, the island portion has no regular shape. Thus, in calculating the size of the island portion in the present specification, each island portion is assumed to be a circle. The diameter of the island portion assumed to be a circle is defined as the "size of the island portion".

In the present specification, the size of the island portion d [nm] is calculated by the equation (iii) from the areas a [$nm^2$] per one island portion at 20 places. Then, the average value of "d" of 20 places is designated as the size of the island portion D [nm] in the present specification.

$$d = (4a/\pi)^{1/2} \quad \text{(iii)}$$

The area ratio of the sea portion and the size of the island portion can be adjusted by the vapor deposition time, the base material temperature during vapor deposition, the material of the base material layer, the material of the primer layer described below, and the like. Specifically, when the vapor deposition time is increased, the size of the island portion can be increased and the proportion of the area of the sea portion can be reduced.

<Adhesive Layer>

The metal tone decorative sheet of the present invention may comprise an adhesive layer to adhere the base material layer on which the metal layer is formed to an adherend. In this case, the adhesive layer is provided on the surface on the opposite side to the base material of the metal layer. The adhesive layer is formed such that the resin for the adhesive layer can enter between the adjacent island portions (the sea portion). The base material layer or the primer layer entered into the sea portion and the resin for the adhesive layer are brought into contact and favorably closely adhered to each other, so that the chipping resistance can be improved.

The adhesive layer is preferably composed of a heat-sensitive or pressure-sensitive resin. In other words, the adhesive layer is preferably a so-called heat-sensitive adhesive layer or pressure-sensitive adhesive layer.

As the resin used in the adhesive layer, a general-purpose acrylic resin, a urethane-based resin, a polyester-based resin, a silicone-based resin, a vinyl chloride-based resin, or a vinyl acetate-based resin, or a mixture or copolymer of two or more thereof is preferably used. From the viewpoint of adhesive strength, an acrylic resin is further preferred.

In the case of the heat-sensitive adhesive layer, the thickness is preferably 0.5 to 3 µm, and more preferably 0.5 to 1.5 µm. In the case of a pressure-sensitive adhesive, the thickness is preferably 20 to 100 µm, and more preferably 30 to 60 µm.

The glass transition temperature Tg of the adhesive layer is preferably 0 to 30° C., more preferably 5 to 28° C., and further preferably 10 to 26° C.

By setting the glass transition temperature to 0° C. or more, the resistance to chipping (chipping resistance) can be easily improved, and the heat resistance is improved, so that reduction in the smoothness of the surface of the decorative molded body is easily prevented. By setting the glass transition temperature to 30° C. or less, the reduction in chipping resistance due to the reduction in close adhesion is easily prevented. Furthermore, when the glass transition temperature is 0 to 30° C., the balance between the chipping resistance of the decorative molded body and the smoothness of the surface of the metal tone decorative sheet at high temperature is improved.

<Release Layer>

The metal tone decorative sheet may comprise a release layer on the surface on the opposite side to the base material of the adhesive layer to protect the adhesive layer. The release layer is easily releasable from the adhesive layer, when a decorative molded product is produced by vacuum molding.

The release layer preferably contains a mold releasing agent to improve releasability. For example, the release layer may be a layer containing a mold releasing agent and a binder resin. Preferred examples of the mold releasing agent include mold releasing agents such as a melamine resin-based mold releasing agent, a silicone-based mold releasing agent, a fluorine resin-based mold releasing agent, a cellulose resin-based mold releasing agent, a urea resin-based mold releasing agent, a polyolefin resin-based mold releasing agent, a paraffin-based mold releasing agent, an acrylic resin-based mold releasing agent, and composite mold release agents thereof. Of these mold releasing agents, a silicone-based mold releasing agent is particularly preferred. As the binder resin, a thermoplastic resin is preferably used, and examples thereof include an acrylic resin, a polyester-based resin, a cellulose derivative resin, a polyvinyl acetal resin, a polyvinyl butyral resin, a vinyl chloride-vinyl acetate copolymer, and a chlorinated polyolefin resin.

The release layer can be formed by coating an ink obtained by dissolving or dispersing a mixture of the above mold releasing agent and binder resin with necessary additives in an appropriate solvent by a known means such as a gravure coating method, a roll coating method, a comma coating method, a gravure printing method, a screen printing method, and a gravure reverse roll coating method, and then drying.

Alternatively, a release film in which a mold releasing layer containing the above mold releasing agent is provided on one surface of a known resin film such as a polyester film, may be used as the release layer.

<Backer Layer>

The metal tone decorative sheet may comprise a backer layer on the inner layer side of the metal layer (on the opposite side to the base material layer interposing the metal layer therebetween). The backer layer has a role to improve the strength of the metal tone decorative sheet and to maintain the shape of the metal tone decorative molded body formed of the metal tone decorative sheet.

The thickness of the backer layer is not particularly limited, and may be appropriately selected within a range of, for example, 0.1 to 10 mm. A plurality of backer layers may be laminated on the inner layer side of the metal layer.

Although the backer layer may be transparent, in order to prevent surface reflection of the backer layer, it is preferably a neutral color other than a white color (e.g., gray or black color), and more preferably a black color.

The backer layer preferably contains a pigment for revealing a neutral color. The pigment of the backer layer may be a black pigment alone or may also be a mixture of a black pigment and other pigment (e.g., a white pigment).

Examples of the binder resin of the backer layer include a polyolefin-based resin, such as polyethylene, polypropylene, polybutene, polymethylpentene, an ethylene-propylene copolymer, an ethylene-propylene-butene copolymer, and an olefin-based thermoplastic elastomer, an ABS (acrylonitrile-butadiene-styrene copolymer) resin, a styrene resin, a vinyl chloride resin, an acrylic resin, and a polycarbonate resin. Of these binder resins, an ABS resin is preferably contained from the viewpoint of preventing a crack during molding. The proportion of the ABS resin relative to the whole backer layer of the resin substrate is preferably 50% by mass or more, more preferably 70% by mass or more, and still more preferably 90% by mass or more.

To the backer layer, any additives, for example, a photo-stabilizer such as an ultraviolet absorber, a plasticizer, a filler, an antioxidant, a lubricant, and an antistatic agent can be added, as needed.

The backer layer preferably has a thermal shrinkage ratio of 1.0% or less, more preferably 0.5% or less, and further preferably 0.1% or less upon heating at 75° C. for 30 minutes. By reducing the thermal shrinkage ratio of the backer layer, the reduction of the metallic luster due to the backer layer can be easily prevented.

<Other Layers>

The metal tone decorative sheet may comprise other layers other than those exemplified above within a range not largely affecting the reflectance.

[Metal Tone Decorative Molded Body]

The metal tone decorative molded body of the present invention is molded by integrally combining an adherend with the metal tone decorative sheet of the present invention. When the metal tone decorative sheet comprises an adhesive layer, the adhesive layer is positioned on the side of the adherend.

<Adherend>

The adherend used in the metal tone decorative sheet of metal tone decorative molded body of the present invention is not particularly limited, and examples thereof include a molded body made of glass, ceramics, resin, or the like.

The adherend used may be one molded into the shape of the molded body in advance, or may be molded into the shape of the molded body during decorative molding by vacuum molding or insert molding.

The thickness of the adherend is not particularly limited, and is usually, 1 mm or more, and preferably 1 to 10 mm.

[Production Method of Metal Tone Decorative Molded Body]

For example, the metal tone decorative molded body can be produced through vacuum molding comprising the following steps (y1) to (y2).

(y1) A laminate in which a surface on the adhesive layer side of a metal tone decorative sheet is attached to an adherend is fabricated.

(y2) The surface on the adherend side of the above laminate is arranged toward a mold and subjected to vacuum molding.

EXAMPLES

Then, the present invention will be described in further detail with reference to Examples, but the present invention is not limited to these Examples in any way.

1. Measurement and Evaluation

The following measurement and evaluations were carried out for the metal tone decorative sheets and metal tone decorative molded bodies obtained in Examples and Comparative Examples. The results are shown in Table 1.

1-1. Electron Microscopy of Cross-Section of Indium Vapor Deposition Film

A sheet piece for observation was cut out from each metal tone decorative sheet of Examples and Comparative Examples and embedded in a thermosetting resin made of a mixture of epoxy phenol novolac and imidazole, and the resin was cured to fabricate each sample for observation. The sample for observation was cut in the lamination direction of the metal tone decorative sheet. The cross-section of the sample for observation was subjected to electron microscopy under the following conditions to obtain a cross-sectional image.

Apparatus: scanning electron microscope (S-4800 manufactured by Hitachi High-Technologies Corporation)
Observation Conditions
    Accelerating voltage: 3 kV
    Emission current: 10 μA
    Pixel size: 0.9 to 1.0 nm
    Working distance: 3.5 mm
    Observation magnification: 50,000 times

1-2. Measurement of Length of Island Portion

From the electron microscope cross-sectional image obtained in the above 1-1., the length x of the side on the base material layer side and the length y of the side on the opposite side to the base material layer side per one island portion were measured according to the definition described above. The difference in length x−y was calculated from the obtained lengths x and y. For each of 10 island portions in the image, x, y, and x−y were obtained. The average value of the difference in length x−y is shown in Table 1.

1-3. Electron Microscopy of Indium Vapor Deposition Film Surface

Another sheet piece for observation was cut out from each metal tone decorative sheet of Examples and Comparative Examples, and each surface of the indium vapor deposition film was observed with an electron microscope to obtain an image. Observation conditions are described below.

Apparatus: scanning electron microscope (SU8040 manufactured by Hitachi High-Technologies Corporation)
Observation Conditions
    Accelerating voltage: 5 kV
    Emission current: 10 μA
    Pixel size: 9.5 to 10.0 nm
    Working distance: 15 mm
    Observation magnification: 10,000 times
    Gradation: 8 bit

1-4. Calculation of Area Ratio of Sea Portion 800,000 pixels were cut out from each electron microscope image of the metal tone decorative sheets of Examples and Comparative Examples obtained under the conditions described in the above 1-3. Each cut image was subjected to binarization processing based on the Otsu's method, and the area ratio of the sea portion (%) was calculated for each of them. The results are shown in Table 1.

1-5. Reflectance Measurement

A sample was cut out from each metal tone decorative sheet of Examples and Comparative Examples, measurement light was made incident on each sample from the base material layer (PMMA) side at an incidence angle of 5° using a spectrometer (trade name: V-670 manufactured by JASCO Corporation), whereby the reflectance of each sample at a wavelength of 550 nm was measured.

The reflectance (wavelength of 550 nm) was measured for samples cut out from 10 places, and the average value thereof was designated as the reflectance of the metal tone decorative sheet (%). The results are shown in Table 1.

1-6. Chipping Resistance

Figure 5:
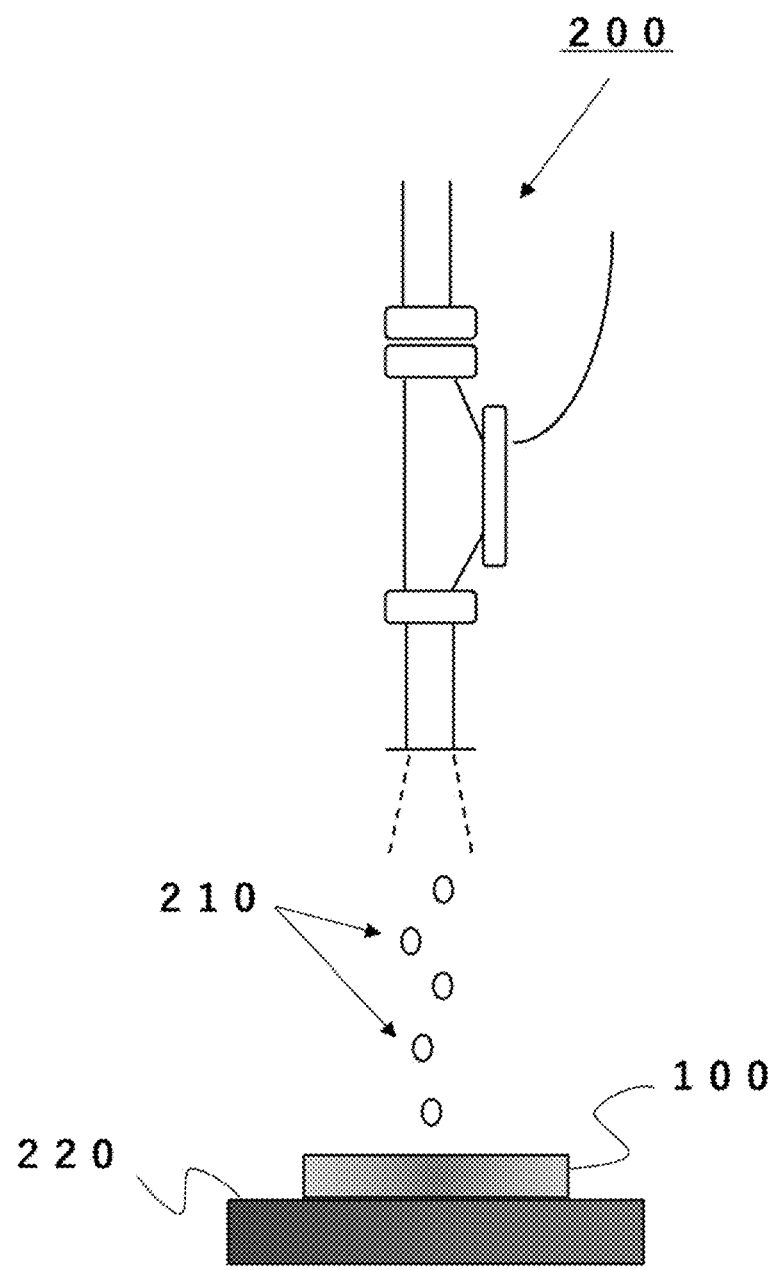
FIG. 5 is a schematic diagram of a gravel testing apparatus for evaluating the chipping resistance of the decorative molded bodies obtained in Examples and Comparative Examples.

The chipping resistance test was carried out according to a gravel test, standard number: SAE J-400, and standard name: test for chip resistance of surface coatings. FIG. 5 is a schematic diagram of a gravel testing apparatus for evaluating the chipping resistance of the metal tone decorative molded bodies obtained in Examples and Comparative Examples. Using a gravel testing apparatus 200, No. 7 crushed stones 210 (100 g) were injected to each metal tone decorative molded body 100 obtained in Examples and Comparative Examples placed on a support for testing 220 (material: ceramic) in the vertical direction of the metal tone decorative molded body 100 from a position with a distance of 350 mm at −20° C. and at an injection pressure of 0.4 MPa for 1 second, and thereafter, the degree of peeling of the film of each metal tone decorative molded body 100 was assessed. The evaluation criteria are as follows.
<Evaluation Criteria>
    A: No peeling of the film was visually observed.
    B: Almost no peeling of the film was visually observed.
    C: Peeling of the film was visually observed.

1-7. Measurement of Surface Free Energy

Using a contact angle meter Drop Master 500 (manufactured by Kyowa Interface Science Co., Ltd.), the contact angle of each primer layer surface obtained in Examples and Comparative Examples was measured by a drop method. Water and diiodomethane (each having a liquid volume of 2 μL) were used as the test liquids. The test environment was 23° C. and a relative humidity of 50%.

For the calculation of the surface free energy, the following equation (A) and equation (B) obtained by combining Owens's equation and Young's equation were used.

$$(1+\cos\theta)\times(\gamma_L/2)=(\gamma_S^d\times\gamma_L^d)^{1/2}+(\gamma_S^p\times\gamma_L^p)^{1/2} \tag{A}$$

$$\gamma_S=\gamma_S^d+\gamma_S^p \tag{B}$$

θ: Contact angle
$\gamma_S$: Surface free energy of measurement surface
$\gamma_L$: Surface free energy of test liquid
$\gamma_S^d$: Dispersion component of surface free energy of measurement surface
$\gamma_L^d$: Dispersion component of surface free energy of test liquid
$\gamma_S^p$: Polar component of surface free energy of measurement surface
$\gamma_L^p$: Polar component of surface free energy of test liquid
The values $\gamma_L$, $\gamma_L^d$, and $\gamma_L^p$ of water and diiodomethane are as follows.
<Water>
$\gamma_L$=72.8 mJ/m², $\gamma_L^d$=21.8 mJ/m², $\gamma_L^p$=51.0 mJ/m²
<Diiodomethane>
$\gamma_L$=50.8 mJ/m², $\gamma_L^d$=48.3 mJ/m², $\gamma_L^p$=2.5 mJ/m²

For each of water and diiodomethane, the surface free energy of the primer layer (measurement surface) was calculated by introducing the values of the contact angle θ, $\gamma_L$, $\gamma_L^d$, and $\gamma_L^p$ obtained in the above measurement into the equation (A) and the equation (B) and solving the simultaneous equations. For calculation, the software attached to the above contact angle meter (FAMAS) was used. The results are shown in Table 1.

2. Fabrication of Metal Tone Decorative Sheet

Example 1

A primer layer-forming coating liquid 1 having the following formulation was fabricated.
On PMMA (trade name "TECHNOLLOY film S001G" manufactured by Escarbo Sheet Co., Ltd., width: 1 m, thickness: 125 μm) serving as the base material layer, the primer layer-forming coating liquid 1 was coated and dried to form a primer layer having a thickness of 2 μm. On the formed primer layer, an indium vapor deposition film was formed under the vapor deposition conditions shown in Table 1 to obtain a metal tone decorative sheet of Example 1. Vapor deposition was carried out using a resistance heating vapor deposition type vapor deposition apparatus (EX-200 manufactured by ULVAC, Inc.). The pressure in the chamber at the start of vapor deposition was $1.0 \times 10^{-3}$ Pa.

<Primer Layer-Forming Coating Liquid 1>
  Acrylic polyol (trade name: ARACOAT DA105 manufactured by Arakawa Chemical Industries, Ltd.) 100 parts by mass
  Isocyanate-based compound (trade name: ARACOAT CL102H manufactured by Arakawa Chemical Industries, Ltd.) 9 parts by mass
  Solvent (trade name: Chemical X-NT solvent manufactured by SHOWA INK MANUFACTURING CO., LTD.) q.s.

Example 2

A primer layer-forming coating liquid 2 having the following formulation was fabricated.
On the same base material layer as in Example 1, the primer layer-forming coating liquid 2 was coated and dried to form a primer layer having a thickness of 2 μm. On the formed primer layer, an indium vapor deposition film was formed under the vapor deposition conditions shown in Table 1 to obtain a metal tone decorative sheet of Example 2.

<Primer Layer-Forming Coating Liquid 2>
  Polyester-based resin (trade name: HS for SIVM manufactured by SHOWA INK MANUFACTURING CO., LTD.) 100 parts by mass
  Isocyanate-based compound (trade name: OP No. 81 manufactured by SHOWA INK MANUFACTURING CO., LTD.) 5.0 parts by mass
  Solvent (trade name: Chemical X-NT solvent manufactured by SHOWA INK MANUFACTURING CO., LTD.) q.s.

Example 3

A primer layer-forming coating liquid 3 having the following formulation was fabricated.
On the same base material layer as in Example 1, the primer layer-forming coating liquid 3 was coated and dried to form a primer layer having a thickness of 2 μm. On the formed primer layer, an indium vapor deposition film was formed under the vapor deposition conditions shown in Table 1 to obtain a metal tone decorative sheet of Example 3.

<Primer Layer-Forming Coating Liquid 3>
  Acrylic resin and vinyl chloride/vinyl acetate copolymer resin ("Chemical X (NT) Medium" manufactured by SHOWA INK MANUFACTURING CO., LTD.)
  Solvent (trade name: Chemical X-NT solvent manufactured by SHOWA INK MANUFACTURING CO., LTD.) q.s.

Example 4

A primer layer-forming coating liquid 4 having the following formulation was fabricated.
On the same base material layer as in Example 1, the primer layer-forming coating liquid 4 was coated and dried to form a primer layer having a thickness of 2 μm.
Then, the primer layer surface was subjected to corona treatment. Corona treatment was carried out using a corona treatment apparatus equipped with an operation/winding apparatus under the conditions of an output of 100 W at a base material-electrode distance of 1.5 mm and a substrate conveyance rate of 20 m/minute.
On the primer layer subjected to corona treatment, an indium vapor deposition film was formed under the vapor deposition conditions shown in Table 1 to obtain a metal tone decorative sheet of Example 4.

<Primer Layer-Forming Coating Liquid 4>
  Vinyl/fluorine-based resin 100 parts by mass
  Isocyanate-based compound (trade name: ARACOAT CL102H manufactured by Arakawa Chemical Industries, Ltd.) 5.0 parts by mass
  Solvent (trade name: Chemical X-NT solvent manufactured by SHOWA INK MANUFACTURING CO., LTD.) q.s.

Comparative Example 1

On the same base material layer as in Example 1, the primer layer-forming coating liquid 1 was coated and dried to form a primer layer having a thickness of 2 μm. On the formed primer layer, an indium vapor deposition film was formed under the vapor deposition conditions shown in Table 1 to obtain a metal tone decorative sheet of Comparative Example 1.

Comparative Example 2

A metal tone decorative sheet of Comparative Example 2 was obtained by the same process as in Example 2 except that the surface of the primer layer was subjected to corona treatment, followed by forming the indium vapor deposition film. Corona treatment was carried out using a corona treatment apparatus equipped with an operation/winding apparatus under the conditions of an output of 100 W at a base material-electrode distance of 1.5 mm and a substrate conveyance rate of 20 m/minute.

3. Fabrication of Metal Tone Decorative Molded Body 100 parts by mass of an acrylic pressure-sensitive adhesive (trade name: SK-Dyne 2094, manufactured by Soken Chemical & Engineering Co., Ltd., solids content: 25% by mass) was mixed with 0.27 parts by mass of an epoxy-based crosslinking agent (trade name: E-AX, manufactured by Soken Chemical & Engineering Co., Ltd., solids content: 5% by mass), to obtain a composition for an adhesive layer. On the release-treated surface of a silicone release-treated polyester film having a thickness of 38 μm (trade name: E7304, manufactured by Toyobo Co., Ltd. width: 1 m), the composition for an adhesive layer was coated and dried such that the thickness after drying was 40 μm to form a pressure-sensitive adhesive sheet (a sheet on which a pressure-sensitive adhesive layer is formed).

On the metal layer of each metal tone decorative sheet of Examples and Comparative Examples, the pressure-sensitive adhesive sheet was placed such that the adhesive layer faced toward the metal layer side, and bonded together under the conditions of a nip pressure of 0.4 MPa and a line rate of 1.0 m/minute.

Then, the polyester film was released from each metal tone decorative sheet of Examples and Comparative Examples, and each metal tone decorative sheet was then attached to a plate-shaped transparent ABS having a thickness of 3 mm via the adhesive layer side. A die having a desired molding shape was prepared, and vacuum molding was carried out such that the surface on the ABS side faced toward the die (ABS plate arrival temperature: 160° C.), whereby each metal tone decorative molded body of Examples and Comparative Examples was obtained.

4. Results

Figure 6:
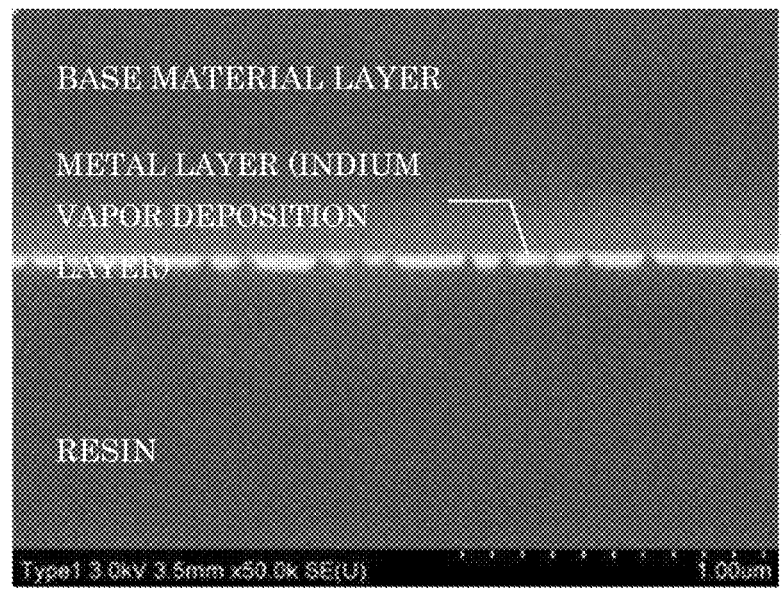
FIG. 6 is a scanning electron micrograph of a cross-section of the metal tone decorative sheet of Comparative Example 1.

1. The electron microscope image of the cross-section of the metal tone decorative sheet of Comparative Example 1 is shown in FIG. 6. Comparing FIG. 1 and FIG. 6, it can be seen that the indium vapor deposition film of Example 1 has a cross-sectional shape closer to a rectangle.

Comparative Example 1 and Example 1 are experimental examples in which metal layers were formed on the same primer layer for different vapor deposition times. Example 1 has a smaller difference in length x−y and a lower area ratio of the sea portion than Comparative Example 1. Consequently, it is considered that the island portion grew such that the increased amount of the length y was greater than that of the length x, as the film thickness increased.

Comparing Examples 1 to 4 and Comparative Example 2, it is recognized that the surface free energy is lower and the difference in length x−y is smaller in Examples than in Comparative Example 2. Also, among Examples, there is a tendency that the smaller the surface free energy, the smaller the difference in length x−y.

TABLE 1

|  | Primer layer | Vapor deposition conditions | | | | Difference in length x − y (nm) | Sea portion area ratio (%) | Reflectance (%) | Chip resistance | Surface free energy (mJ/m$^2$) |
|---|---|---|---|---|---|---|---|---|---|---|
|  |  | Temperature (° C.) | Rate (nm/sec) | Vapor deposition time (sec) | Corona treatment |  |  |  |  |  |
| Example 1 | Acrylic polyol + isocyanate | 23 | 1.2 | 40 | No | 23 | 15 | 62 | A | 47.0 |
| Example 2 | Polyester + isocyanate | 23 | 1.2 | 40 | No | 14 | 15 | 61 | A | 45.4 |
| Example 3 | Acrylic resin + vinyl chloride/vinyl acetate copolymer resin | 23 | 1.2 | 40 | No | 20 | 20 | 60 | A | 46.3 |
| Example 4 | Vinyl/fluorine-based resin + isocyanate | 23 | 1.2 | 40 | Yes | 9 | 15 | 62 | B | 44.1 |
| Comparative Example 1 | Acrylic polyol + isocyanate | 23 | 1.2 | 30 | No | 85 | 20 | 54 | A | 47.0 |
| Comparative Example 2 | Polyester + isocyanate | 23 | 1.2 | 40 | Yes | 90 | 16 | 57 | A | 51.4 |

In Examples 1 to 4, indium vapor deposition films in which the difference in length x−y satisfies 0 nm to 80 nm were formed, resulting in metal tone decorative sheets having a high reflectance. In particular, chipping resistance was favorable in Examples 1 to 3. This is considered to be because the composition for an adhesive layer is sufficiently entered between island portions (sea portion) and thus favorable close adhesion was ensured between the metal layer and the adhesive layer as well as between the primer layer and the adhesive layer.

On the other hand, Comparative Example 1 and Comparative Example 2 respectively had a large difference in length x−y of 85 nm and 90 nm and the cross-sectional shape of the island portion thereof was a trapezoid, resulting in metal tone decorative sheets having a low reflectance. Since Comparative Example 1 and Comparative Example 2 had a large difference in length x−y, the slope of the side surface of the island portion became flatter, the composition for an adhesive layer was easily entered between island portions, and favorable close adhesion was ensured between the adhesive layer and the primer layer, so that they could obtain favorable chipping resistance.

The electron microscope image of the cross-section of the metal tone decorative sheet of Example 1 is shown in FIG.

Typically, corona treatment tends to increase the wettability to the metal layer. It can be said that Example 4 is an example that the wettability to the metal layer was improved by subjecting the primer layer surface to corona treatment and the island portion in which the difference in length x−y satisfies the equation (1) was formed. On the other hand, in Comparative Example 2, the surface free energy became too large as compared with Example 2 due to corona treatment, the wettability to the metal layer became too high, and the difference in length x−y did not satisfy the equation (1).

Example 5

Figure 7:
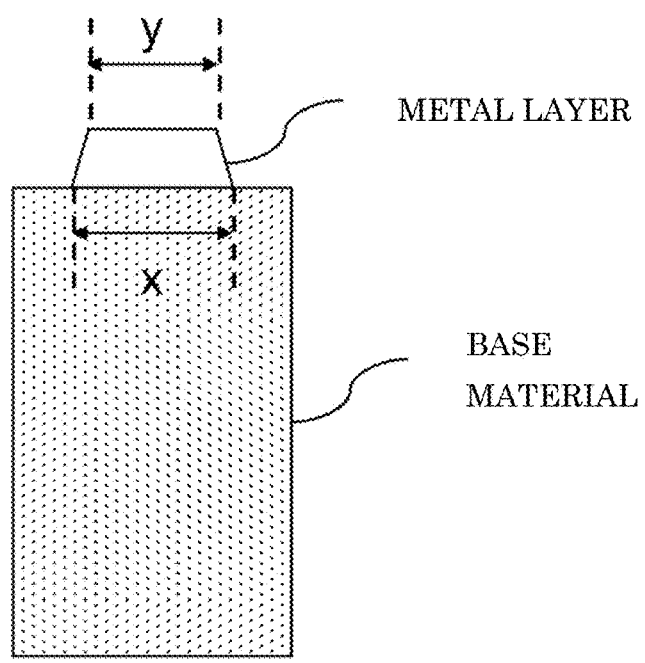
FIG. 7 is a diagram for illustrating a thin line model used in Example 5.

The thin line model illustrated in FIG. 7 was calculated based on the rigorous coupled wave analysis (RCWA) method by simulation of the reflectance of the metal tone decorative sheet (%) at a wavelength of 550 nm when the size of the island portion (length x and y) and the area ratio of the sea portion were changed.

The simulation was carried out by simplifying the sea-island structure to one dimension. In the above simulation, the layer configuration of the metal tone decorative sheet was the base material layer (PMMA)/the metal layer (indium vapor deposition film). The length of the side x on the base material layer side of the island portion and the length y of the side on the opposite side to the base material layer are illustrated in FIG. 7. A light emitting surface was arranged on the base material layer side, and the setting was made such that light was made incident on the base material layer at an incidence angle of 5°.

In the model in FIG. 7, the length x of the side on the base material layer side of the island portion corresponds to the size of the island portion. In FIG. 7, although the cross-section of the island portion is represented as a trapezoid, the difference in length x–y being 0 means that the cross-section of the island portion is a rectangle.

The parameters used in the calculation are as follows.

Optical constants of base material layer: n=1.49, k=0
Thickness of base material layer: 1.0 μm
Optical constants of metal layer: n=1.0556, k=4.9524
Thickness of metal layer: 50 nm
Size of island portion: 100 nm to 300 nm
Numerical value of x–y: 0 nm to 100 nm
Area ratio of sea portion: 10 to 25%

The simulation results of the reflectance when the length x and the difference in length x–y were changed are shown in Tables 2 to 5 for the cases where the area ratio of the sea portion was changed to 10%, 15%, 20%, and 25%, respectively.

TABLE 2

| | | Length x (nm) | | | | |
|---|---|---|---|---|---|---|
| | | 100 | 150 | 200 | 250 | 300 |
| Difference in length x – y (nm) | 0 | 65 | 67 | 67 | 68 | 67 |
| | 5 | 63 | 66 | 67 | 67 | 67 |
| | 10 | 61 | 65 | 66 | 67 | 67 |
| | 20 | 57 | 62 | 65 | 66 | 66 |
| | 40 | 49 | 58 | 62 | 65 | 65 |
| | 60 | — | — | 60 | 63 | 64 |
| | 80 | — | — | 57 | 58 | 60 |
| | 100 | — | — | — | — | 59 |

TABLE 3

| | | Length x (nm) | | | | |
|---|---|---|---|---|---|---|
| | | 100 | 150 | 200 | 250 | 300 |
| Difference in length x – y (nm) | 0 | 61 | 64 | 65 | 66 | 63 |
| | 5 | 60 | 63 | 64 | 66 | 62 |
| | 10 | 58 | 62 | 64 | 65 | 62 |
| | 20 | 54 | 60 | 63 | 65 | 62 |
| | 40 | 46 | 55 | 60 | 63 | 61 |
| | 60 | — | 50 | 57 | 61 | 60 |
| | 80 | — | — | — | 59 | 60 |
| | 100 | — | — | — | — | 58 |

TABLE 4

| | | Length x (nm) | | | | |
|---|---|---|---|---|---|---|
| | | 100 | 150 | 200 | 250 | 300 |
| Difference in length x – y (nm) | 0 | 57 | 61 | 63 | 64 | 63 |
| | 5 | 56 | 60 | 63 | 64 | 62 |
| | 10 | 54 | 59 | 62 | 63 | 62 |
| | 20 | 50 | 57 | 61 | 63 | 62 |
| | 40 | — | 53 | 58 | 62 | 61 |
| | 60 | — | — | — | 59 | 60 |
| | 80 | — | — | — | 58 | 58 |
| | 100 | — | — | — | — | 57 |

TABLE 5

| | | Length x (nm) | | | | |
|---|---|---|---|---|---|---|
| | | 100 | 150 | 200 | 250 | 300 |
| Difference in length x – y (nm) | 0 | 54 | 58 | 61 | 62 | 61 |
| | 5 | 53 | 57 | 60 | 62 | 61 |
| | 10 | 52 | 56 | 59 | 61 | 61 |
| | 20 | 49 | 54 | 58 | 61 | 60 |
| | 40 | — | — | 55 | 59 | 59 |
| | 60 | — | — | — | 57 | 57 |
| | 80 | — | — | — | — | — |
| | 100 | — | — | — | — | — |

As is apparent from Tables 2 to 5, there was a tendency that a high reflectance of 60% or more could be obtained as the difference in length x–y became small in the same size of the island portion (length x), regardless of the area ratio of the sea portion. In addition, there was also a tendency that the larger the size of the island portion, the higher the reflectance.

It is apparent from the results in Tables 2 to 5 that the desired reflectance can be obtained by changing the difference in length x–y in any area ratio of the sea portion. In particular, when the difference in length x–y falls within a range of 0 nm to 80 nm, the metal tone decorative sheet having a high reflectance can be obtained. It is also apparent when the area ratio of the sea portion is relatively large, high reflectance can be obtained by reducing the difference in length x–y.

100 Molded body
200 Gravel testing apparatus
210 Crushed stone
220 Support for testing

The invention claimed is:

1. A metal tone decorative sheet comprising a metal layer on a base material layer, and
   a heat-sensitive adhesive layer or a pressure-sensitive adhesive layer on a metal layer side being an opposite side to the base material layer, wherein:
   the metal layer comprises a plurality of island portions containing metal and a sea portion positioned between the island portions;
   the island portion is a convex quadrangle in a cross-sectional view, one side of the quadrangle being opposed to the base material layer; and
   0 nm≤x–y≤80 nm where a length of a side of the island portion on the base material layer side is x, in nm, and a length of a side of the island portion on an opposite side to the base material layer is y, in nm.

2. The metal tone decorative sheet according to claim 1, wherein a reflectance at a wavelength of 550 nm is 60% or more.

3. The metal tone decorative sheet according to claim 1, wherein the sea portion are filled with a part of the heat-sensitive adhesive layer or the pressure-sensitive adhesive layer, and
   the x, in nm, and the y, in nm, satisfy 0 nm<x–y≤80 nm.

4. The metal tone decorative sheet according to claim 3, wherein the x, in nm, and the y, in nm, satisfy 10 nm≤x–y≤80 nm.

5. The metal tone decorative sheet according to claim 1, wherein an area ratio of the sea portion when the metal layer is viewed in a plan view is 10% or more and 25% or less.

6. The metal tone decorative sheet according to claim 1, wherein when each island portion is assumed to be a circle and an average value of the diameter calculated from an area per one island portion is defined as a size of the island portion, the size is 100 nm or more and 300 nm or less.

7. The metal tone decorative sheet according to claim 1, wherein the metal layer contains indium or tin.

8. A metal tone decorative molded body comprising the metal tone decorative sheet according to claim 1 and an adherend.

* * * * *